United States Patent
Jung et al.

(10) Patent No.: US 7,528,633 B2
(45) Date of Patent: May 5, 2009

(54) CURRENT SENSING CIRCUIT AND BOOST CONVERTER HAVING THE SAME

(75) Inventors: Sang-Hwa Jung, Bucheon-si (KR); Dong-Hee Kim, Bucheon-si (KR)

(73) Assignee: Fairchild Korea Semiconductor Ltd., Puchon, Kyungki-do (KR)

( * ) Notice: Subject to any disclaimer, the term of this patent is extended or adjusted under 35 U.S.C. 154(b) by 0 days.

(21) Appl. No.: 11/560,783

(22) Filed: Nov. 16, 2006

(65) Prior Publication Data
US 2007/0115741 A1    May 24, 2007

(30) Foreign Application Priority Data
Nov. 21, 2005    (KR) .................. 10-2005-0111139

(51) Int. Cl.
*G01R 19/00* (2006.01)
(52) U.S. Cl. .............................. 327/51; 327/52; 327/53
(58) Field of Classification Search .................. 327/51, 327/52, 53
See application file for complete search history.

(56) References Cited

U.S. PATENT DOCUMENTS

| 5,519,310 | A | 5/1996 | Bartlett |
| 5,815,027 | A | 9/1998 | Tihanyi et al. |
| 6,600,362 | B1 * | 7/2003 | Gavrila ........................ 327/541 |
| 6,624,671 | B2 * | 9/2003 | Fotouhi ....................... 327/112 |
| 7,301,347 | B2 * | 11/2007 | Dearn et al. ................. 324/522 |

* cited by examiner

*Primary Examiner*—Kenneth B. Wells
(74) *Attorney, Agent, or Firm*—Townsend and Townsend and Crew LLP

(57) ABSTRACT

A current sensing circuit and a boost converter including the current sensing circuit are disclosed. The current sensing circuit includes a switching device, a sensing transistor, and a current sensing amplifier, and senses the current flowing through the switching device. The current sensing amplifier maintains a potential of an output terminal of the switching transistor substantially equal to a potential of an output terminal of the sensing transistor based on a difference between an output current of the switching device and an output current of the sensing transistor. Accordingly, the current sensing circuit accurately senses the current flowing through the switching device.

22 Claims, 12 Drawing Sheets

CURRENT SENSING CIRCUIT AND BOOST CONVERTER HAVING THE SAME

CROSS-REFERENCES TO RELATED APPLICATIONS

This application claims priority under 35 U.S.C. § 119 of Korean Patent Application No. 2005-0111139 filed on Nov. 21, 2005, the contents of which are herein incorporated by reference in their entirety.

BACKGROUND OF THE INVENTION

The present invention relates to a current sensing circuit and a current sensing method, and particularly to a current sensing circuit and a current sensing method for sensing a current flowing through a power device.

In general, a current mode direct current-to-direct current (DC-DC) converter includes a power metal-oxide semiconductor field-effect transistor (MOSFET) to induce a current in an inductor. The power MOSFET switches in response to a control voltage having a pulse waveform. To generate a stable output voltage, a switching current flowing through a power MOSFET is sensed. The sensed switching current is converted into a voltage that is fed back to a control terminal of the power MOSFET. A switching current flowing through the power MOSFET may be sensed by a sense MOSFET coupled to the power MOSFET.

When the drain-source voltage of a power MOSFET is changed, the ratio of a current flowing through the power MOSFET to a current flowing through the sense MOSFET may change.

FIG. 1 is a circuit diagram illustrating a conventional current mirror circuit, and FIG. 2 is a graph illustrating a relationship between a drain-source voltage (VDS) and a drain current (ID) of a conventional MOS transistor.

Referring to FIG. 1, a current generated by a current source IS flows through an NMOS transistor MN1, and an NMOS transistor MN2 is coupled in a current-mirror configuration to the NMOS transistor MN1. For transistors MN1 and MN2 being of equal size, a current flowing through the NMOS transistor MN2, which is a current flowing through a resistor R1, is equal to the current flowing through the NMOS transistor MN1 when the NMOS transistor MN2 is operated in a saturation region. Referring to FIG. 2, in a saturation region REG2, when the effect of channel-length-modulation is ignored, a drain current ID of NMOS transistor is constant regardless of a drain-source voltage VDS. However, in triode region REG1, the drain current ID of NMOS transistor changes with the drain-source voltage VDS. Thus, when operating in triode region REG1, the drain currents of NMOS transistors MN1 and MN2 would be equal only if both the gate-source voltage VGS and drain-source voltage VDS of transistors MN1 and MN2 are equal.

FIG. 3 is a circuit diagram illustrating a conventional voltage-to-current converter as disclosed in U.S. Pat. No. 5,519,310, wherein a voltage sensing technique is used to force the drain-source voltage VDS of two NMOS transistors MN12 and MN11 to be equal.

Referring to FIG. 3, the voltage-to-current converter includes PMOS transistors MP11 and MP12, NMOS transistors MN11, MN12 and MN13, operational amplifiers OA1 and OA2 and a resistor R11. In FIG. 3, an output current IOUT flowing through the NMOS transistor MN11 is sensed by the NMOS transistor MN12 that has its gate coupled to the gate of the NMOS transistor MN11. A current flowing through the NMOS transistor MN12 is provided to a current-mirror circuit comprised of PMOS transistors MP11 and MP12, and a current flowing through the PMOS transistor MP12 is converted into a voltage by the resistor R11. The operational amplifier OA1 amplifies a difference between an input voltage signal VIN and a feedback voltage signal VF and provides the amplified signal to the gates of NMOS transistors MN12 and MN11. The operational amplifier OA2 and the NMOS transistor MN13 operate to force a drain-source voltage of the NMOS transistor MN12 to be equal to a drain-source voltage of the NMOS transistor MN11. As a result, the current flowing through the NMOS transistor MN12 is proportional to the current flowing through the NMOS transistor MN11.

However, the voltage-to-current converter of FIG. 3 has drawbacks as described below.

The operational amplifier OA2 included in FIG. 3 has a common mode input signal that is near ground voltage GND. Therefore, an amplifier such as a folded cascode amplifier that includes PMOS transistors need to be used. A transient response of the folded cascode amplifier is slow when a quiescent current, i.e., a maximum output current, is limited. In order to make the transient response of the circuit of FIG. 3 fast, the quiescent current needs to be increased which increases the power consumption. In general, the maximum output current is limited in applications with low power requirements.

BRIEF SUMMARY OF THE INVENTION

Exemplary embodiments of the present invention provide a current sensing circuit that accurately senses the current through the power MOSFET and has a simple circuit structure and fast transient response in a low quiescent current environment.

Exemplary embodiments of the present invention also provide a boost converter having a current sensing circuit that has a simple circuit structure and fast transient response in a low quiescent current environment.

According to one exemplary embodiment of the present invention, a current sensing circuit includes a switching device, a sensing transistor, and a current sensing amplifier. The switching device is coupled between an output node and a first reference voltage source, and pulls down the output node in response to a gate control voltage biasing the switching device in a conducting state. The sensing transistor is coupled to the switching device, and generates a sensing current proportional to a current flowing through the switching device. The current sensing amplifier maintains the output node and an output terminal of the sensing transistor at substantially the same potential based on a difference between an output current of the switching device and an output current of the sensing transistor. Further, the current sensing amplifier generates a current proportional to a current flowing through the sensing transistor.

According to another exemplary embodiment of the present invention, the current sensing amplifier further includes a start-up circuit that starts up the current sensing amplifier.

According to still another exemplary embodiment of the present invention, the current sensing amplifier further includes blocking transistors that prevent a current flow from the output node to the current sensing amplifier when the switching transistor is in a non-conducting state.

According to still another exemplary embodiment of the present invention, a boost converter includes an inductive device, a switching device, a current sensing circuit, and a driving circuit.

The inductive device is coupled between an input node and a first node and provides a first current to the first node. The switching device is coupled between the first node and a first reference voltage source, and induces the first current in the inductive device in response to a gate control signal biasing the switching device in a conducting state. The current sensing circuit generates a first sensing voltage in response to a switching current flowing through the switching device. The driving circuit generates the gate control signal in response to the first sensing voltage. Here, the current sensing circuit comprises a sensing transistor and a current sensing amplifier.

The sensing transistor is coupled to the switching device, and generates a sensing current proportional to a current flowing through the switching device.

The current sensing amplifier maintains the first node and an output terminal of the sensing transistor at substantially the same potential based on a difference between an output current of the switching device and an output current of the sensing transistor. Further, the current sensing amplifier generates a current proportional to a current flowing through the sensing transistor.

BRIEF DESCRIPTION OF THE DRAWINGS

The foregoing and other features and advantages of the invention will be apparent from the description of exemplary embodiments of the invention, as illustrated in the accompanying drawings. Like reference characters refer to like elements throughout the drawings.

DETAILED DESCRIPTION OF THE INVENTION

Figure 1:
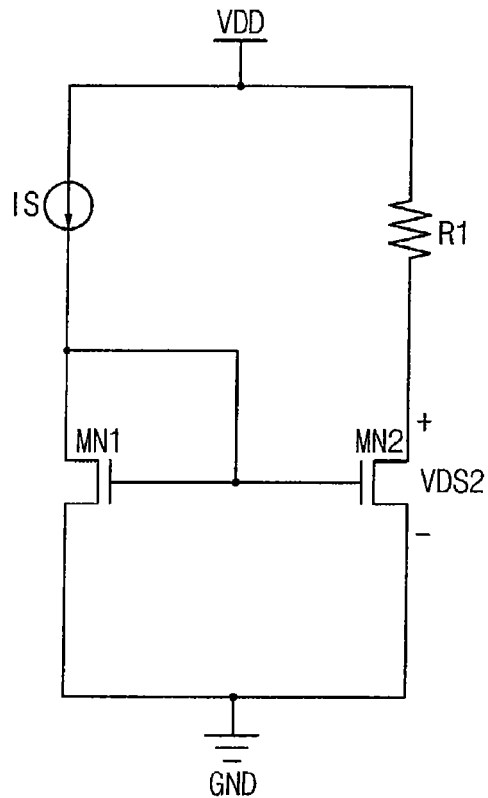
FIG. 1 is a circuit diagram illustrating a conventional current mirror circuit.
Figure 2:
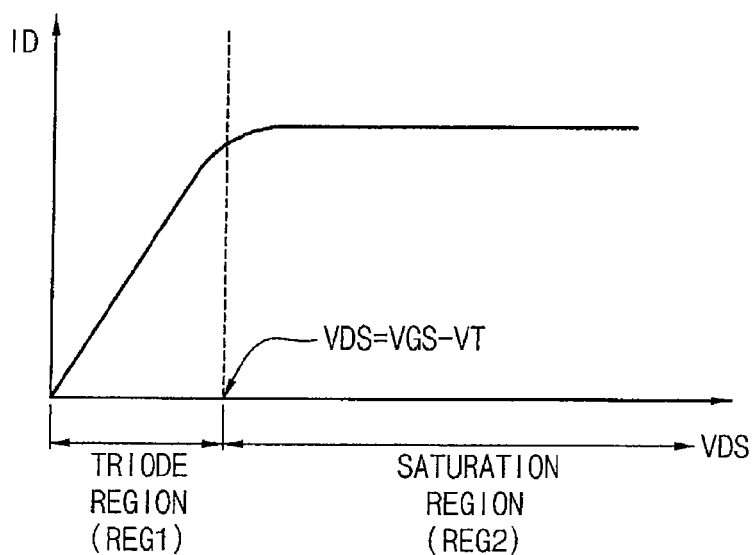
FIG. 2 is a graph illustrating a relationship between a drain-source voltage (VDS) and a drain current (ID) of a conventional MOS transistor.
Figure 3:
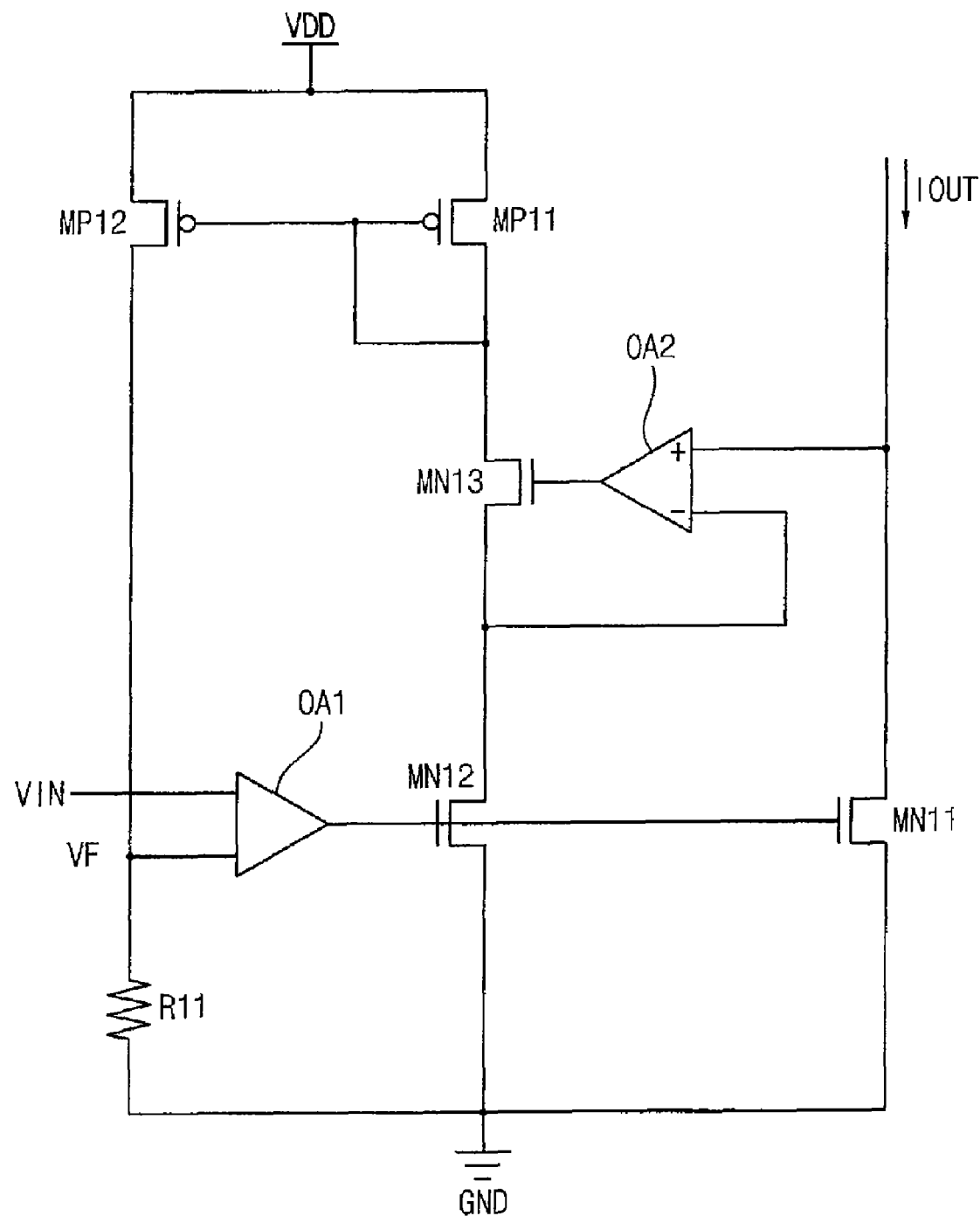
FIG. 3 is a circuit diagram illustrating a conventional voltage-to-current converter.

Exemplary embodiments of the present invention are disclosed herein. However, specific structural and functional details disclosed herein are merely illustrative and are provided for purposes of describing exemplary embodiments of the present invention. Thus, exemplary embodiments of the present invention disclosed herein may be embodied in many alternate forms and should not be construed as limited to the exemplary embodiments set forth herein.

Accordingly, while various modifications and alternative forms of the invention are possible, specific embodiments thereof are shown by way of example in the drawings and will herein be described in detail. It should be understood, however, that there is no intent to limit the invention to the particular circuit configurations disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (i.e., "between" versus "directly between", "adjacent" versus "directly adjacent", etc.).

The terminology used herein is for the purpose of describing particular embodiments only and is not intended to be limiting. As used herein, the singular forms "a" and "an" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
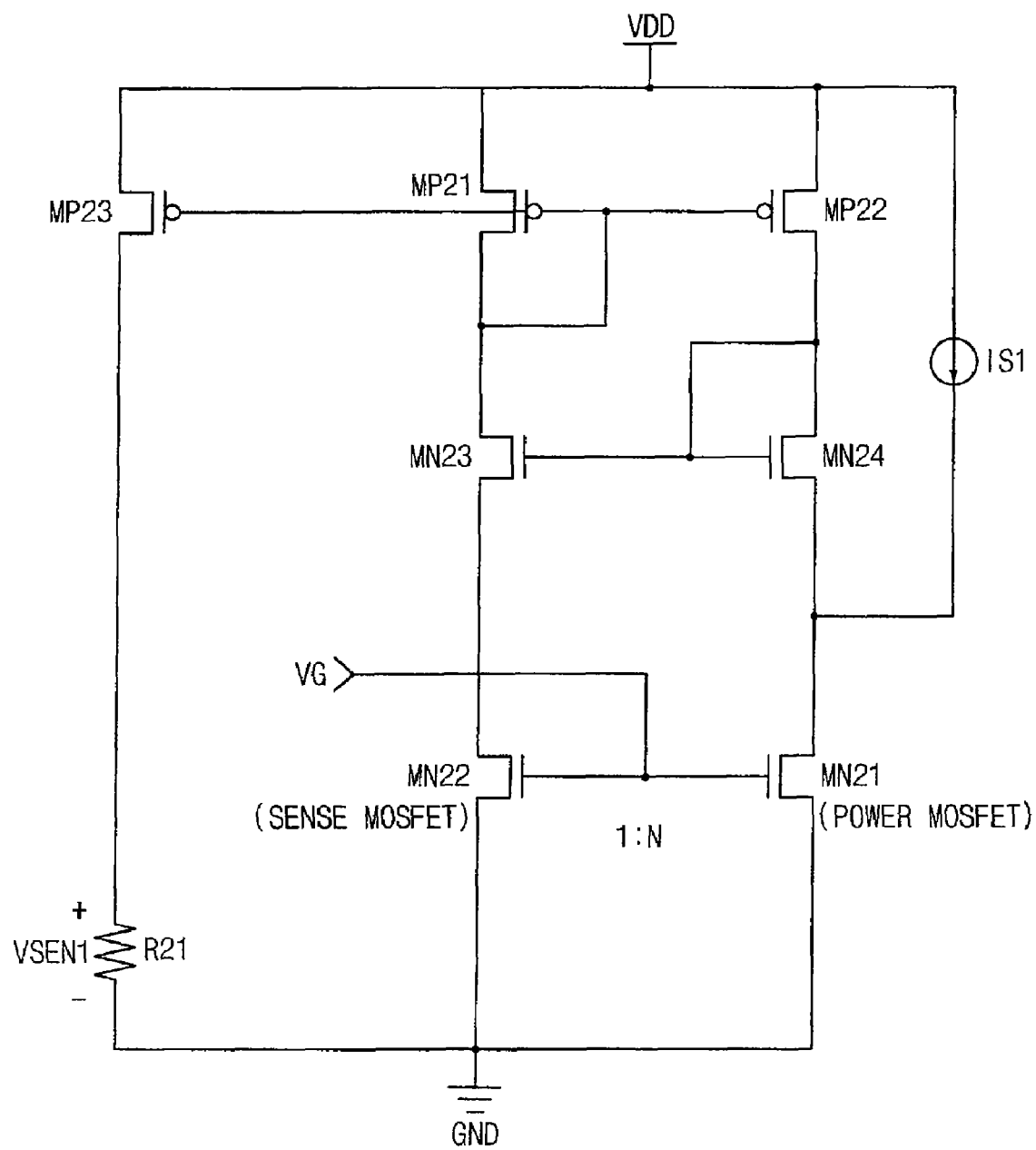
FIG. 4 is a circuit diagram illustrating a current sensing circuit according to an exemplary embodiment of the present invention.

FIG. 4 is a circuit diagram illustrating a current sensing circuit according to an exemplary embodiment of the present invention. Referring to FIG. 4, the current sensing circuit includes n-channel metal-oxide semiconductor (NMOS) transistors MN21 to MN24, p-channel metal-oxide semiconductor (PMOS) transistors MP21 to MP23, a resistor R21 and a current source IS1.

The NMOS transistors MN21 and MN22 switch states in response to a gate control voltage VG. Each of the NMOS transistor MN24 and the PMOS transistor MP21 has a diode-connected structure (i.e., their gate and drain terminals are shorted together). The NMOS transistor MN24 and the NMOS transistor MN23 form a current-mirror circuit, and the PMOS transistor MP21 and the PMOS transistor MP22 form a current-mirror circuit. The resistor R21 is coupled between a drain of the PMOS transistor MP23 and the ground voltage GND and generates a sensing voltage VSEN1. In one embodiment, NMOS transistor MN21 is a power MOSFET capable of conducting a high current, and the NMOS transistor MN22 is a sense MOSFET.

Hereinafter, the operation of the current sensing circuit of FIG. 4 will be described.

A current proportional to a current flowing through the NMOS transistor MN21 flows through the NMOS transistor MN22. The current source IS1 supplies a current to the NMOS transistor MN21 when the NMOS transistor MN21 is turned on.

When implemented in a semiconductor integrated circuit, the size of the NMOS transistor MN22 may be smaller than the size of the NMOS transistor MN21. For example, the ratio of the size of the NMOS transistor MN22 to the size of the NMOS transistor MN21 may be 1:N where N is a positive integer.

The NMOS transistor MN22 senses the current flowing through the NMOS transistor MN21 and generates a sensing current. For a ratio of the size of the NMOS transistor MN22 to the size of the NMOS transistor MN21 of 1:N, a current that is 1/N of the current flowing through the NMOS transistor MN21 flows through the NMOS transistor MN22. Each of the NMOS transistor MN21 and the NMOS transistor MN22 has an on-resistance. If the on-resistance of the NMOS transistor MN21 is Ron, then the on-resistance of the NMOS transistor MN22 is N×Ron.

The NMOS transistor MN24, the NMOS transistor MN23, the PMOS transistor MP21 and the PMOS transistor MP22 form a current sensing amplifier. When a gate voltage of the NMOS transistor MN23 increases by ΔV, a drain current of the NMOS transistor MN23 increases by ΔV/(N×Ron) and a drain current of the NMOS transistor MN24 increases by ΔV/Ron. As a drain of the NMOS transistor MN23 is electrically coupled to a drain of the PMOS transistor MP21, a drain current of the PMOS transistor MP21 is equal to a drain current of the NMOS transistor MN23. As the PMOS transistor MP22 is coupled in a current-mirror configuration to the PMOS transistor MP21, a drain current of the PMOS transistor MP22 is equal to a drain current of the PMOS transistor MP21.

Therefore, when a gate voltage of the NMOS transistor MN23 increases by ΔV, a drain current of the NMOS transistor MN23 increases by ΔV/(N×Ron) and a drain current of the PMOS transistor MP22 increases by ΔV/(N×Ron). As a drain of the NMOS transistor MN24 and a drain of the PMOS transistor MP22 are electrically coupled to each other, a drain current of the PMOS transistor MP22 will flow through the NMOS transistor MN24. However, when a gate voltage of the NMOS transistor MN23 increases by ΔV, a drain current of the NMOS transistor MN23 increases by ΔV/(N×Ron) and a drain current of the NMOS transistor MN24 increases by ΔV/Ron. Here, when N is very large, the relationship of ΔV/(N×Ron)<<ΔV/Ron. Therefore, a voltage of a drain node of the NMOS transistor MN24 decreases.

When the voltage of the drain node of the NMOS transistor MN24 decreases, a gate voltage of the NMOS transistor MN23 decreases and a drain current of the NMOS transistor MN23 decreases. When the drain current of the NMOS transistor MN23 decreases, the drain current of the PMOS transistor MP21 decreases and the drain current of the PMOS transistor MP22 decreases. Therefore, a voltage of the drain node of the NMOS transistor MN24 will decrease. However, when the gate voltage of the NMOS transistor MN23 decreases by ΔV, a drain current of the NMOS transistor MN23 decreases by ΔV/(N×Ron) and a drain current of the NMOS transistor MN24 decreases by ΔV/Ron. Here, when N is very large, the relationship of ΔV/(N×Ron)<<ΔV/Ron. Therefore, a voltage of a drain node of the NMOS transistor MN24 increases.

As described above, the current sensing amplifier comprised of the NMOS transistor MN24, the NMOS transistor MN23, the PMOS transistor MP21 and the PMOS transistor MP22 operates as a negative feedback amplifier. By a negative feedback loop of the negative feedback amplifier, the drain current of the PMOS transistor MP22 is equal to the drain current of the NMOS transistor MN24. Therefore, the drain node of the NMOS transistor MN24 has a stable and constant voltage. Further, the amount of the current flowing through the NMOS transistor MN23 becomes equal to the amount of the current flowing through the NMOS transistor MN24 by the negative feedback loop comprised of the NMOS transistor MN24, the NMOS transistor MN23, the PMOS transistor MP21 and the PMOS transistor MP22.

Accordingly, the amount of the gate-source voltage of the NMOS transistor MN23 becomes equal to the amount of the gate-source voltage of the NMOS transistor MN24. Therefore, the amount of the drain-source voltage of the NMOS transistor MN22, which is a current sensing transistor, becomes equal to the amount of the drain-source voltage of the NMOS transistor MN21, which is a power MOSFET. Because the size of the NMOS transistor MN21 is N times larger than the size of the NMOS transistor MN22, the current that has an amount of 1/N of the current flowing through the NMOS transistor MN21 flows through the NMOS transistor MN22.

Because the current sensing amplifier comprised of MOS transistors MN23, MN24, MP21 and MP22 has one pole, a capacitor for compensation may not be included in the circuit.

When the on-resistance of the switching device MN21 is Ron and the on-resistance of the sensing transistor MN22 is N×Ron, the loop gain of the current sensing circuit of FIG. 4 can be represented as a numerical expression 1.

$$Aloop = \left( \frac{1}{1/gm24 + Ron} - \frac{1}{1/gm23 + N \times Ron} \right) \times (ro24 // ro22)$$ Expression 1

Here, gm24 denotes the transconductance of MN24, gm23 denotes the transconductance of MN23, ro22 denotes the output resistance of MP22 and ro24 denotes the output resistance of MN24, respectively.

When the loop gain is low, there may be a case in which the ratio of the sensing current to the current flowing through the switching transistor is not constant. Therefore, in one embodiment, it is preferable that the transconductance of MN24 and the transconductance of MN23 are large.

Figure 5:
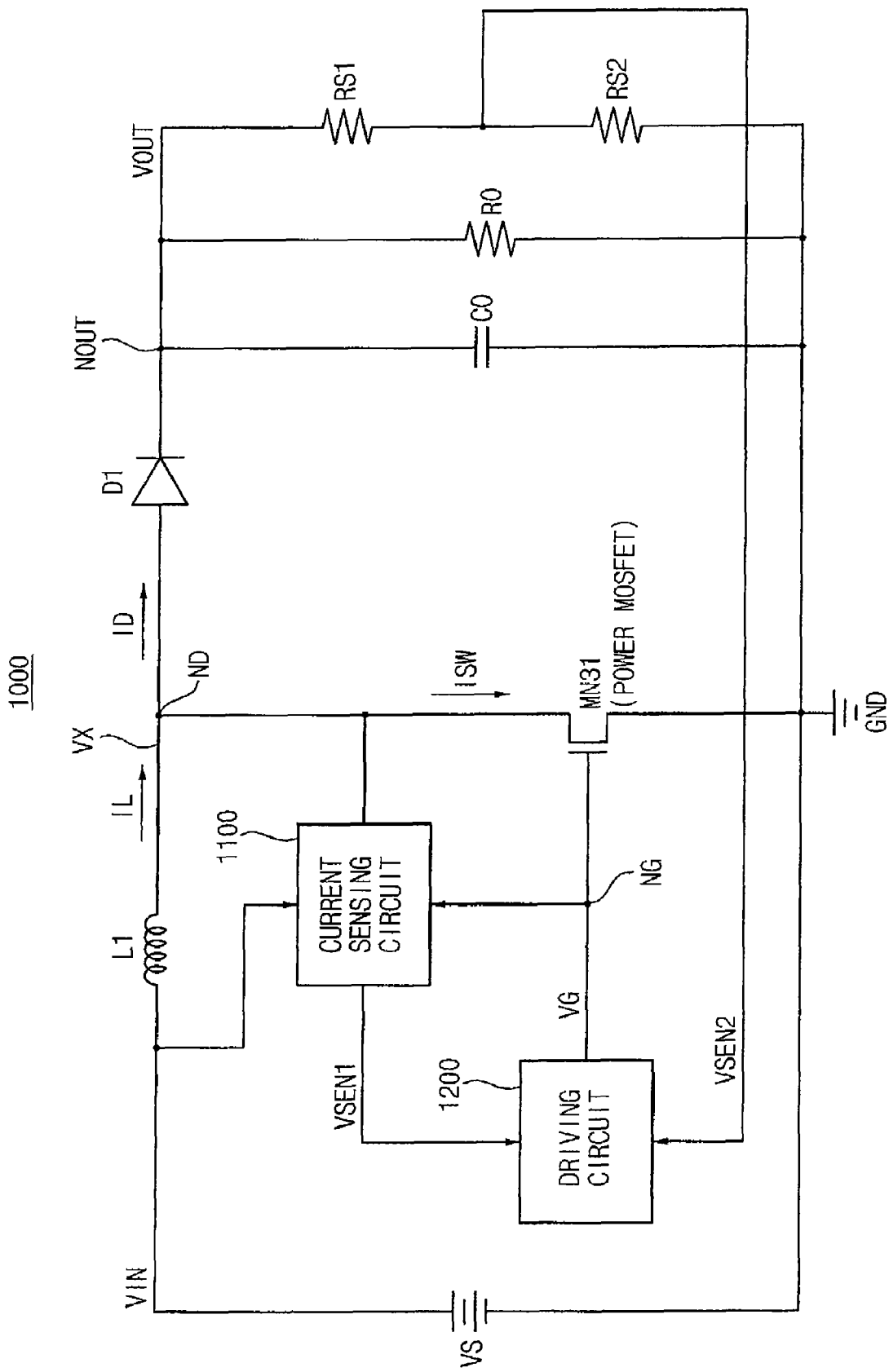
FIG. 5 is a circuit diagram illustrating a boost converter according to an exemplary embodiment of the present invention.

FIG. 5 is a circuit diagram illustrating a boost converter according to an exemplary embodiment of the present invention.

Referring to FIG. 5, the boost converter 1000 includes an inductor L1, a switching device MN31, a current sensing circuit 1100 and a driving circuit 1200. Further, the boost converter 1000 may include a diode D1, a capacitor C0, a load resistor R0, resistors RS1 and RS2 and DC voltage source VS.

The inductor L1 generates a current IL and provides the current IL to the node ND. When the switching device MN31 is in the off state, the current IL flowing through the inductor L1 flows through the diode D1. The diode current ID is stored in the capacitor C0. The switching device MN31 is coupled to the node ND, and switches in response to the gate control signal VG and induces the current IL in the inductor L1.

The current sensing circuit 1100 is coupled to a drain and a gate of the switching device MN31. The current sensing circuit 1100 generates the sensing voltage VSEN1 in response to the switching current ISW and provides the sensing voltage VSEN1 to the driving circuit 1200. The driving circuit 1200 generates the gate control voltage VG based on the sensing voltages VSEN1 and VSEN2.

Figure 6:
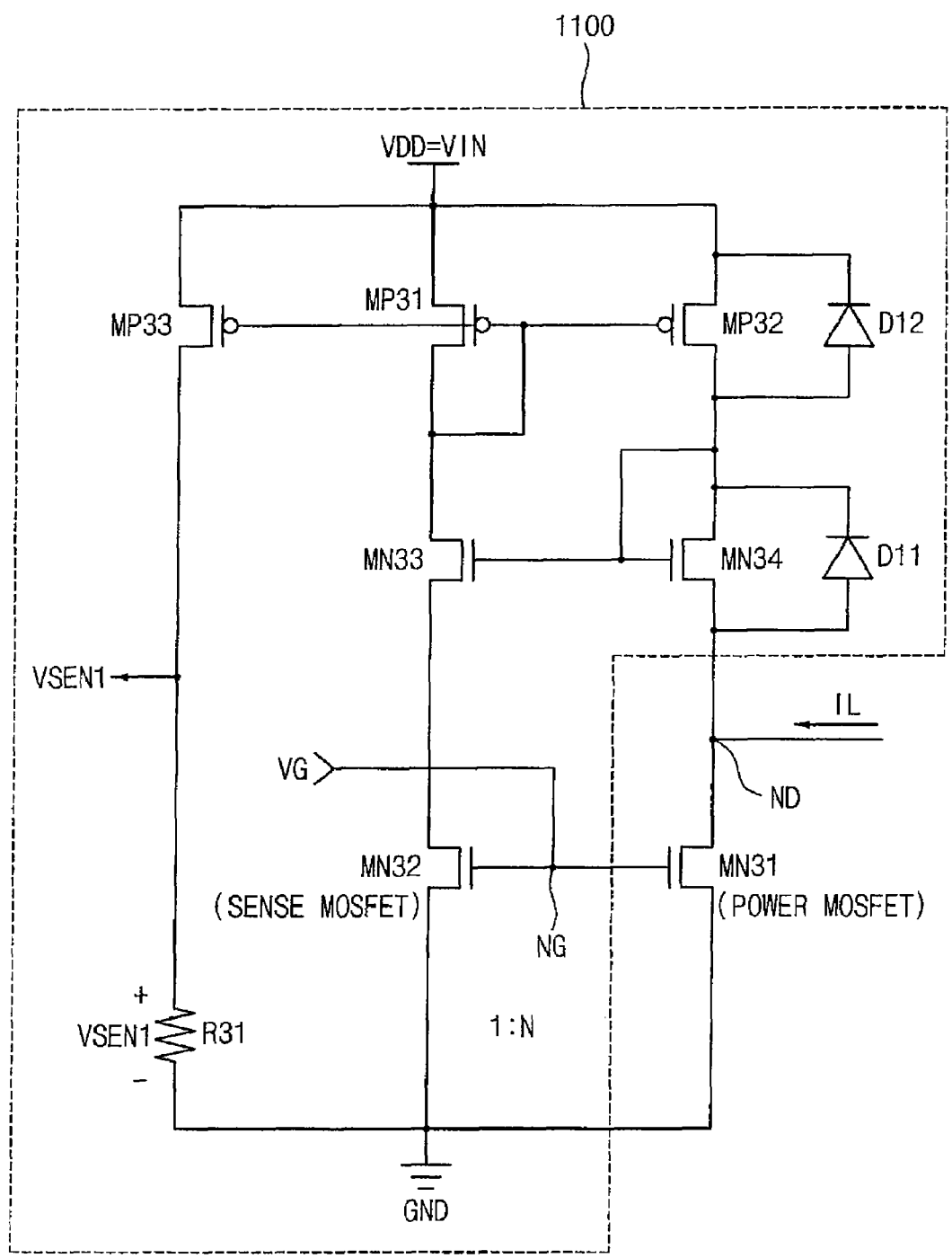
FIG. 6 is a circuit diagram illustrating an exemplary embodiment of the current sensing circuit in the boost converter of FIG. 5.

FIG. 6 is a circuit diagram illustrating an exemplary embodiment of the current sensing circuit 1100 included in the boost converter 1000 of FIG. 5.

Referring to FIG. 6, the current sensing circuit 1100 is similar to the current sensing circuit shown in FIG. 4. In the current sensing circuit 1100 of FIG. 6, the current IL flowing through the inductor L1 (FIG. 5) is shown instead of the current source IS1 (FIG. 4). Diodes D11 and D12 are parasitic diodes associated with NMOS transistor MN34 and the PMOS transistor MP32, respectively.

Figure 11:
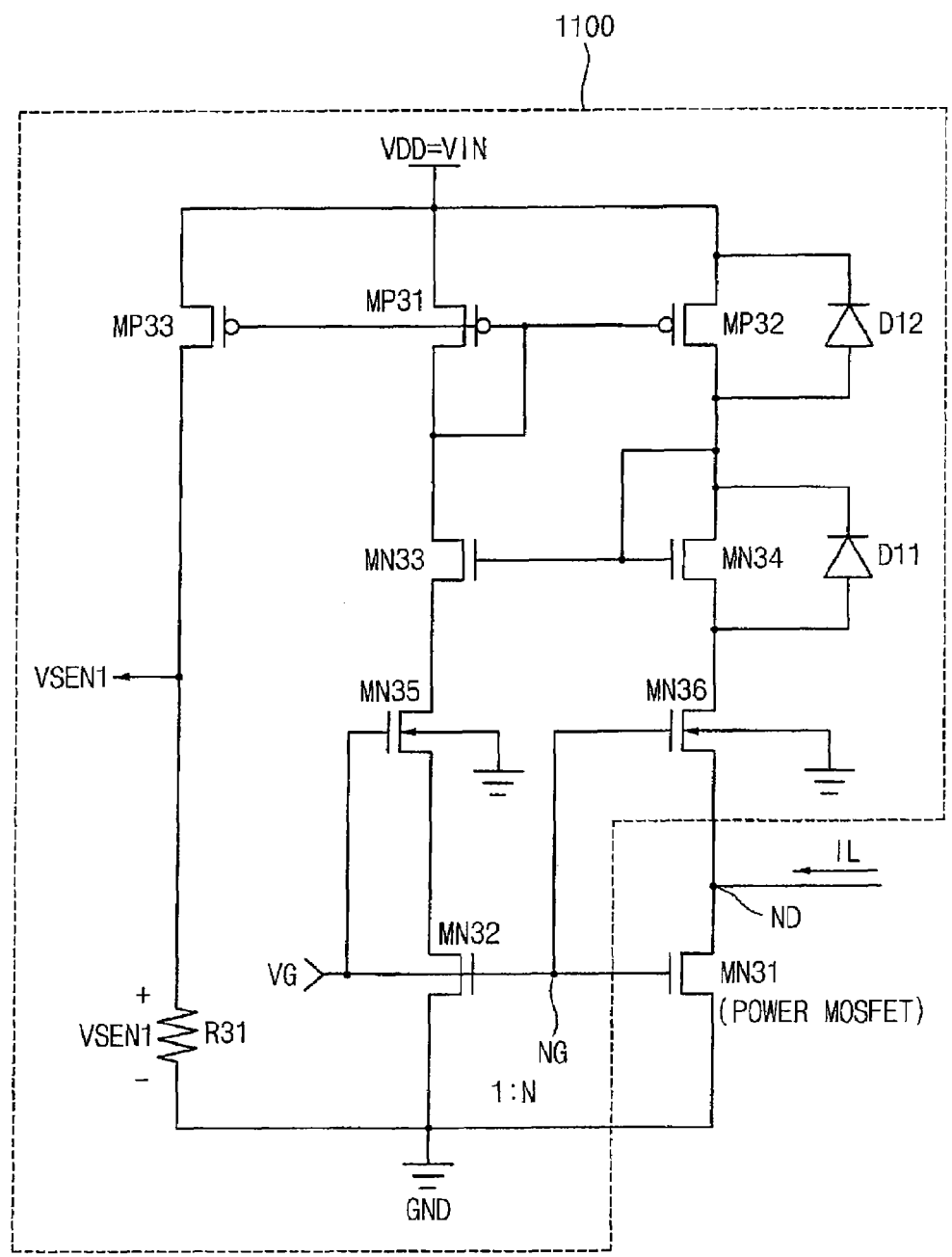
FIG. 11 is a circuit diagram illustrating still another exemplary embodiment of the current sensing circuit in the boost converter of FIG. 5.
Figure 12:
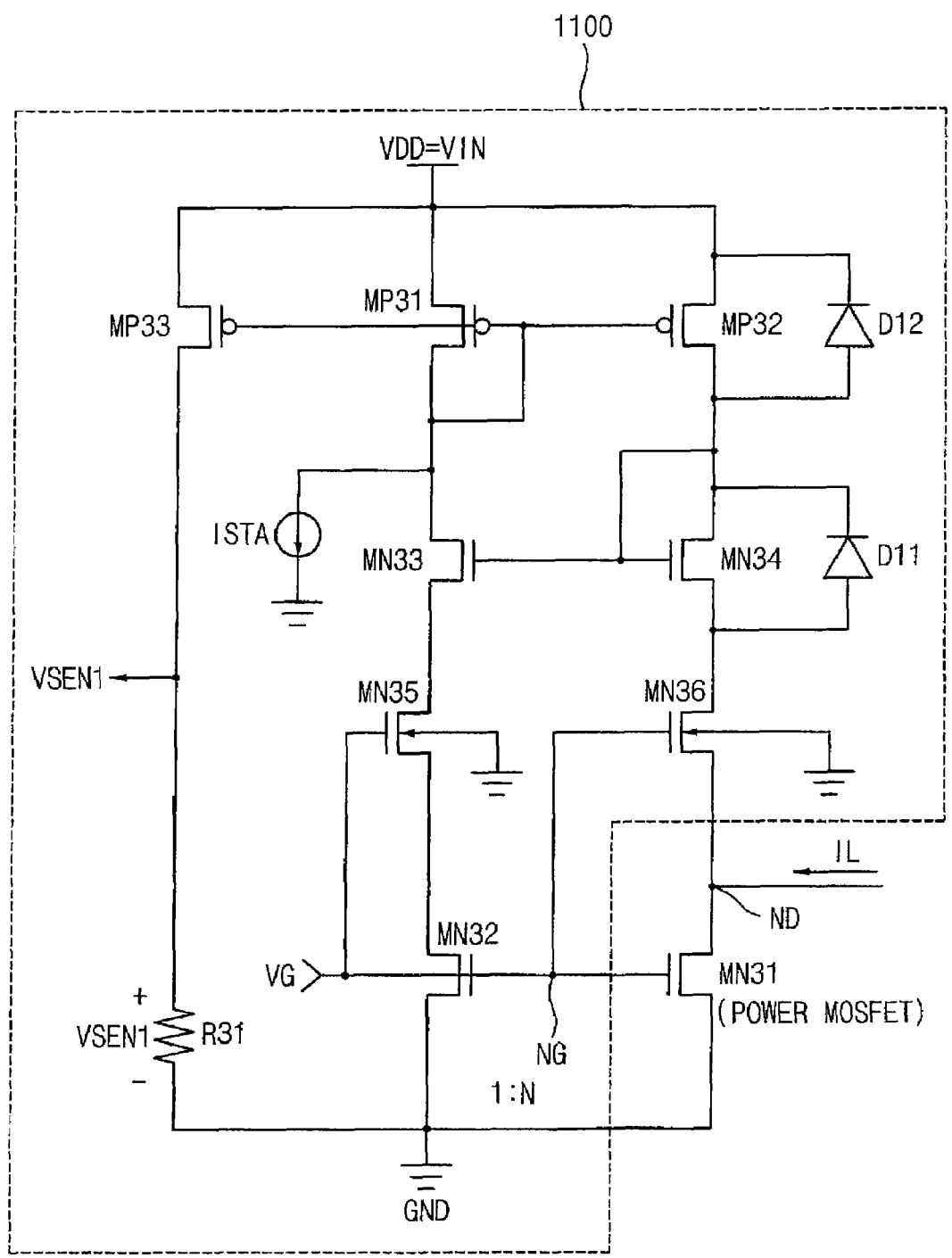
FIG. 12 is a circuit diagram illustrating still another exemplary embodiment of the current sensing circuit in the boost converter of FIG. 5.
Figure 13:
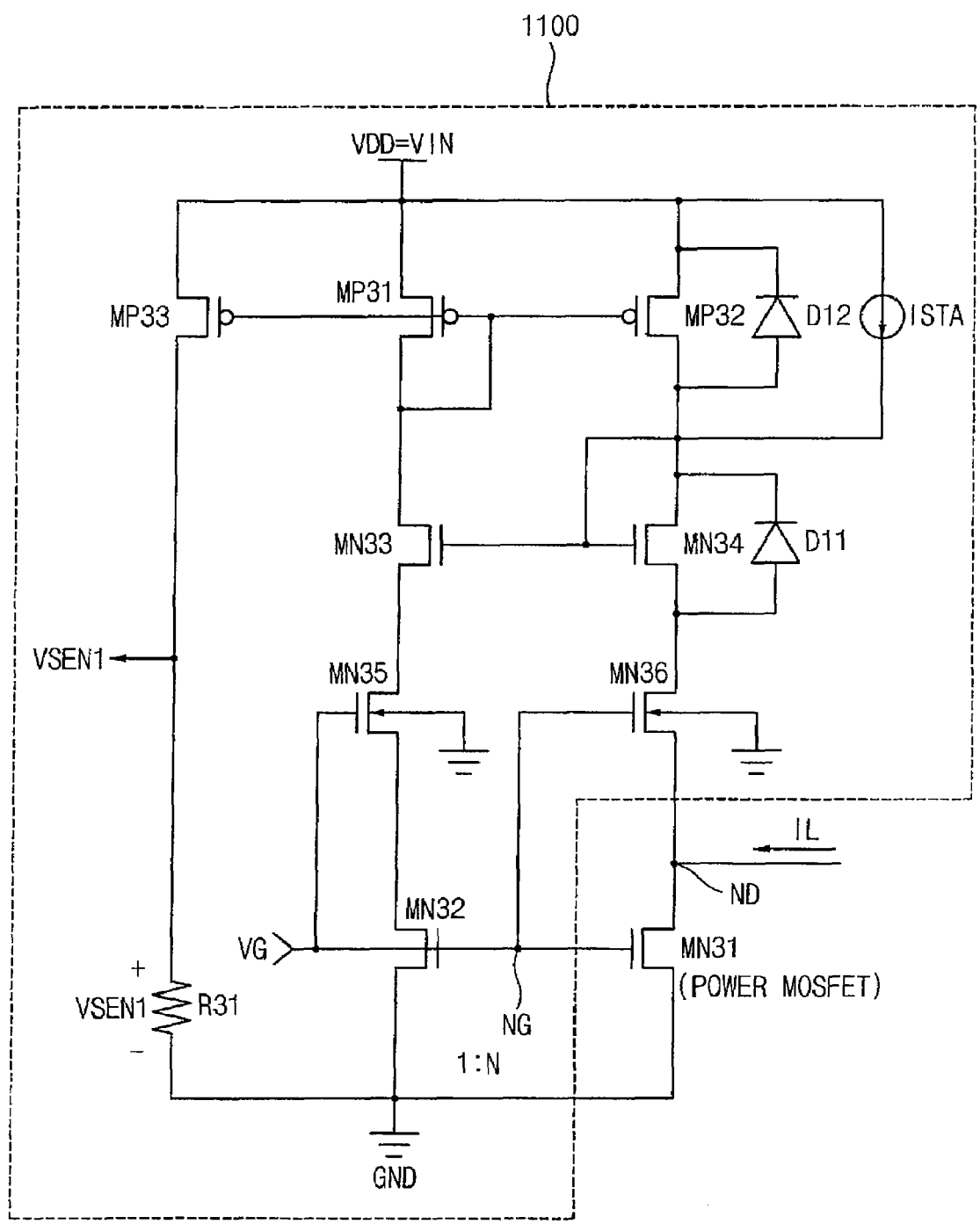
FIG. 13 is a circuit diagram illustrating still another exemplary embodiment of the current sensing circuit in the boost converter of FIG. 5.

Accordingly, when the NMOS transistor MN31 is in the on state, the inductor current IL flows through the NMOS transistor MN31. However, when the NMOS transistor MN31 is in the off state, diodes D11 and D12 provide a path through which the inductor current IL flows. Thus, a means for blocking the flow of the inductor current through diodes D11 and D12 is needed. Embodiments wherein blocking transistors are used for this purpose are shown in FIGS. 11-13, which are described in more detail further below. As shown in FIG. 6, the supply voltage VDD of the current sensing circuit 1100 corresponds to the input voltage VIN of the boost converter 1000 of FIG. 5.

Figure 7:
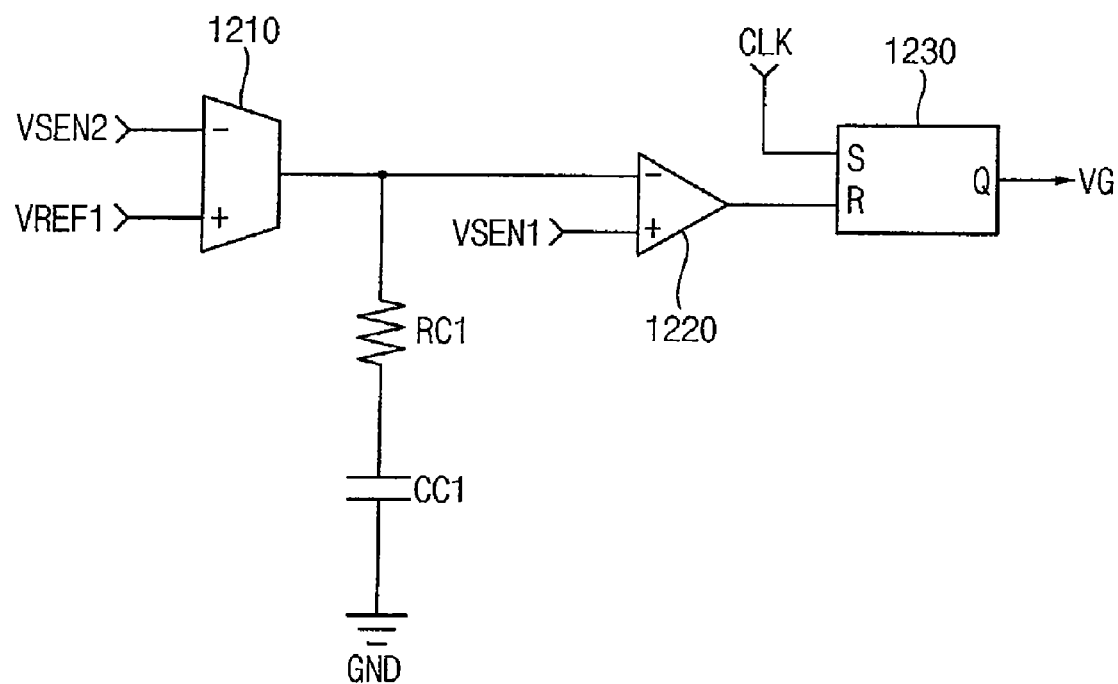
FIG. 7 is a circuit diagram illustrating an exemplary embodiment of the driving circuit in the boost converter of FIG. 5.

FIG. 7 is a circuit diagram illustrating an exemplary embodiment of a driving circuit included in the boost converter of FIG. 5. Referring to FIG. 7, the driving circuit 1200 includes an error amplifier 1210, a comparator 1220 and a flip-flop 1230. Further, the driving circuit 1200 includes a resistor RC1 and a capacitor CC1 that performs low-pass filtering on the output signal of the error amplifier 1210.

Hereinafter, the operation of the driving circuit 1200 of FIG. 7 will be described.

Referring back to FIG. 5, the output voltage VOUT of the boost converter 1000 is divided by the resistors RS1 and RS2 and the divided voltage is applied to the driving circuit 1200 as sensing voltage VSEN2. Referring to FIG. 7, the error amplifier 1210 compares the sensing voltage VSEN2 with the reference voltage VREF1. The flip-flop 1230 may be an SR flip-flop, and is set by the clock signal CLK and reset by an output signal of the comparator 1220. The gate control voltage VG, which is an output of the driving circuit 1200, is applied to a gate of the switching device MN31 in FIG. 5 and to the current sensing circuit 1100 in FIG. 5.

Figure 8:
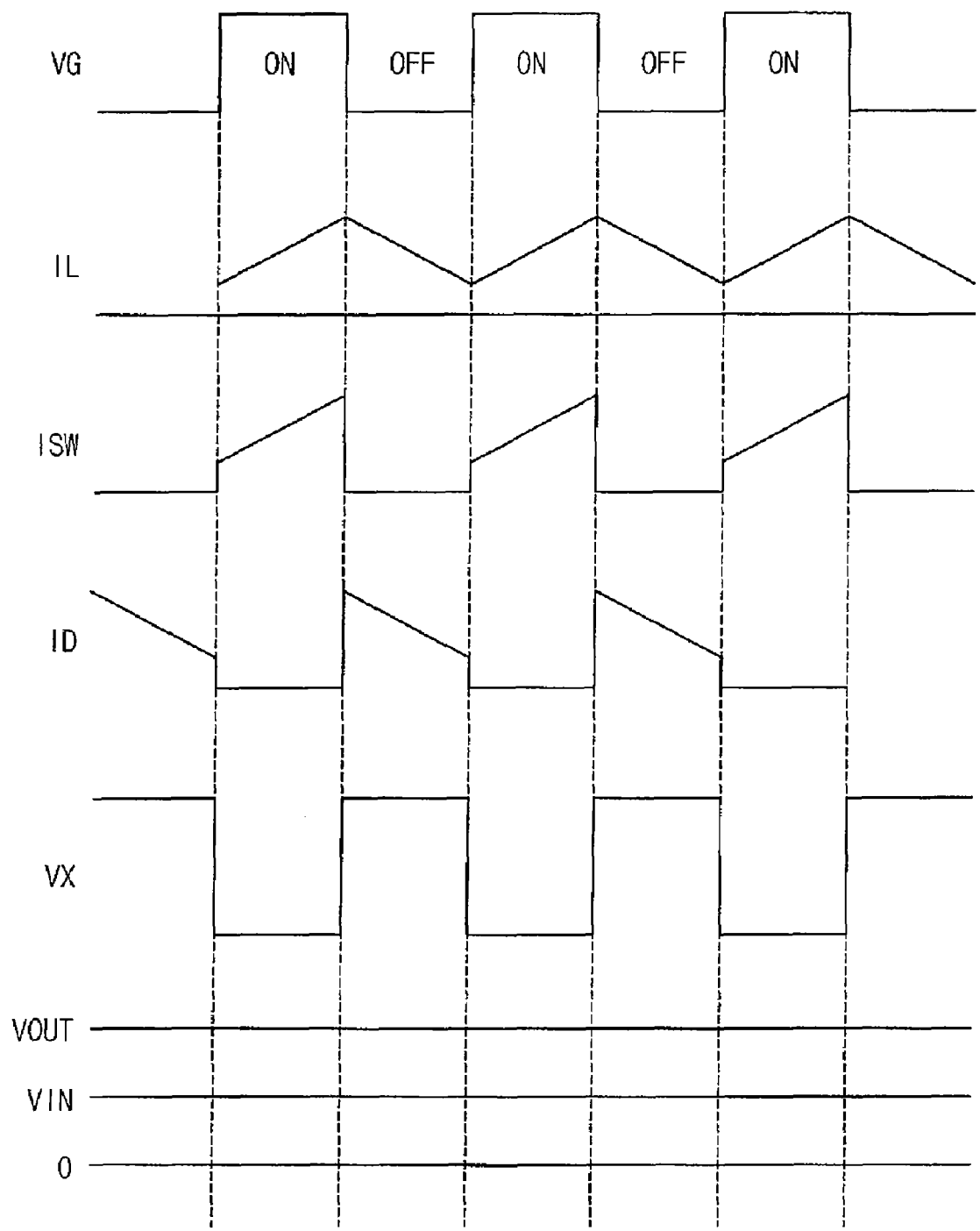
FIG. 8 is a timing diagram illustrating the operation of the boost converter of FIG. 5.

FIG. 8 is a timing diagram illustrating the operation of the boost converter of FIG. 5. In FIG. 8, VG denotes a waveform of the gate control voltage, IL denotes a waveform of the current flowing through the inductor L1, ISW denotes a waveform of the current flowing through the switching device, VX denotes a voltage waveform of the node ND, which is an input terminal of the diode D1, VIN denotes a waveform of the input voltage of the boost converter 1000 and VOUT denotes a waveform of the output voltage of the boost converter 1000, respectively.

Referring to FIG. 8, VG is a pulse wave having a predetermined duty. When VG has a logic high state the switching device MN31 in FIG. 5 is in the on state, and when VG has a logic low state the switching device MN31 in FIG. 5 is in the off state. IL increases linearly with time when VG has a logic high state and decreases linearly with time when VG has a logic low state. ISW increases linearly with time when VG has a logic high state and has a voltage of nearly 0V when VG has a logic low state. ID has a value of nearly 0A when VG has a logic high state, and decreases linearly with time when VG has a logic low state. VX has a logic low state when VG has a logic high state and has a logic high state when VG has a logic low state.

The output voltage VOUT of the boost converter 1000 is a DC voltage that is higher than the input voltage VIN of the boost converter 1000.

Hereinafter, the operation of the boost converter 1000 according to an exemplary embodiment of the present invention will be described referring to FIG. 5 to FIG. 8.

The boost converter 1000 of FIG. 5 boosts the DC input signal VIN to generate a stable output voltage. The input signal VIN is a DC voltage and may be obtained by rectifying and smoothing an AC voltage. The switching device MN31 is a device capable of conducting a high current and may be comprised of a power MOSFET or an insulated gate bipolar transistor (IGBT). The boost converter 1000 senses the current ISW flowing through the switching device and the output voltage VOUT in order to generate a stable output voltage. The boost converter 1000 feeds back a voltage divided by the resistors RS1 and RS2 as a sensing voltage VSEN2. Further, the boost converter 1000 feeds back a sensing voltage VSEN1 that is proportional to the current flowing through the switching device MN31. A current changing in response to the gate control voltage VG flows through the switching device MN31. When the switching device MN31 is in the on state, the inductor current IL flows through the switching device MN31.

Referring to FIG. 6, the current sensing circuit 1100 includes a sensing transistor MN32 with its gate coupled to the gate of the switching device MN31, and a current sensing amplifier and generates a sensing voltage VSEN1 that is proportional to a current flowing through the switching device MN31. The sensing transistor MN32 may have a much smaller size than the size of the switching device MN31, and the current flowing through the sensing transistor MN32 may be much lower than the current flowing through the switching device MN31. The current sensing amplifier includes NMOS transistors MN33 and MN34 and PMOS transistors MP31 and MP32. The current sensing amplifier maintains a potential at the drain, which is node ND, of the switching device MN31 substantially equal to a potential at the drain of the sensing transistor MN32 using the difference between the current flowing through the NMOS transistor MN31 and the current flowing through the NMOS transistor MN32. The current sensing amplifier includes a current mirror circuit comprised of NMOS transistors MN33 and MN34 and another current mirror circuit comprised of PMOS transistors MP31 and MP32, wherein the two current mirror circuits are coupled in series.

Accordingly, the current sensing circuit 1100 of FIG. 6 includes the sensing transistor MN32 and the current sensing amplifier comprised of the NMOS transistors MN33 and MN34 and the PMOS transistors MP31 and MP32. Therefore, the current sensing circuit 1100 of FIG. 6 maintains a drain-source voltage of the switching device MN31 substantially equal to a drain-source voltage of the sensing transistor MN32. Further, the current sensing circuit 1100 of FIG. 6 generates a current exactly proportional to the current flowing through the switching device MN31 and generates the sensing voltage VSEN1 proportional to the current flowing through the switching device MN31. When the sensing voltage VSEN1 is exact, the gate control voltage VG becomes exact and the switching device MN31 may be controlled exactly.

Figure 9:
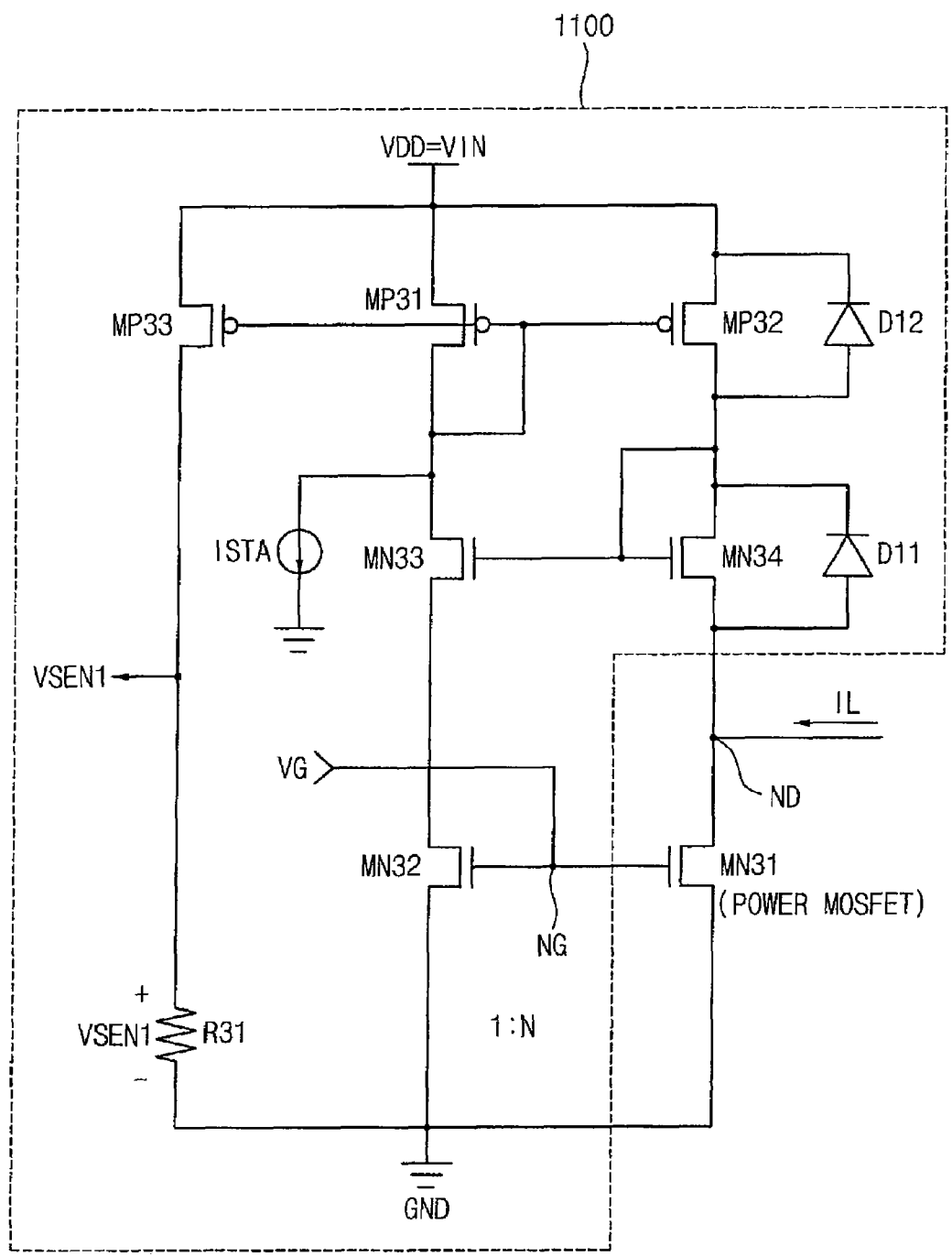
FIG. 9 is a circuit diagram illustrating another exemplary embodiment of the current sensing circuit in the boost converter of FIG. 5.

FIG. 9 is a circuit diagram illustrating another exemplary embodiment of a current sensing circuit included in the boost converter of FIG. 5. The current sensing circuit of FIG. 9 has a circuit structure in which a start-up circuit is added to the current sensing circuit of FIG. 6. Therefore, the operation of the current sensing circuit of FIG. 9, which is similar to the operation of the current sensing circuit of FIG. 6, will not be described.

The start-up circuit starts up the current sensing amplifier and includes a current source ISTA. The current source ISTA is included between a drain of the NMOS transistor MN33 and the ground GND for stably starting the current sensing amplifier comprised of NMOS transistors MN33 and MN34 and PMOS transistors MP31 and MP32. It is preferable that the start-up current supplied to start up the current sensing amplifier is less than the current flowing through the sensing transistor MN32 in order to minimize the current sensing error. For example, the start-up current may be about 1 μA.

Figure 10:
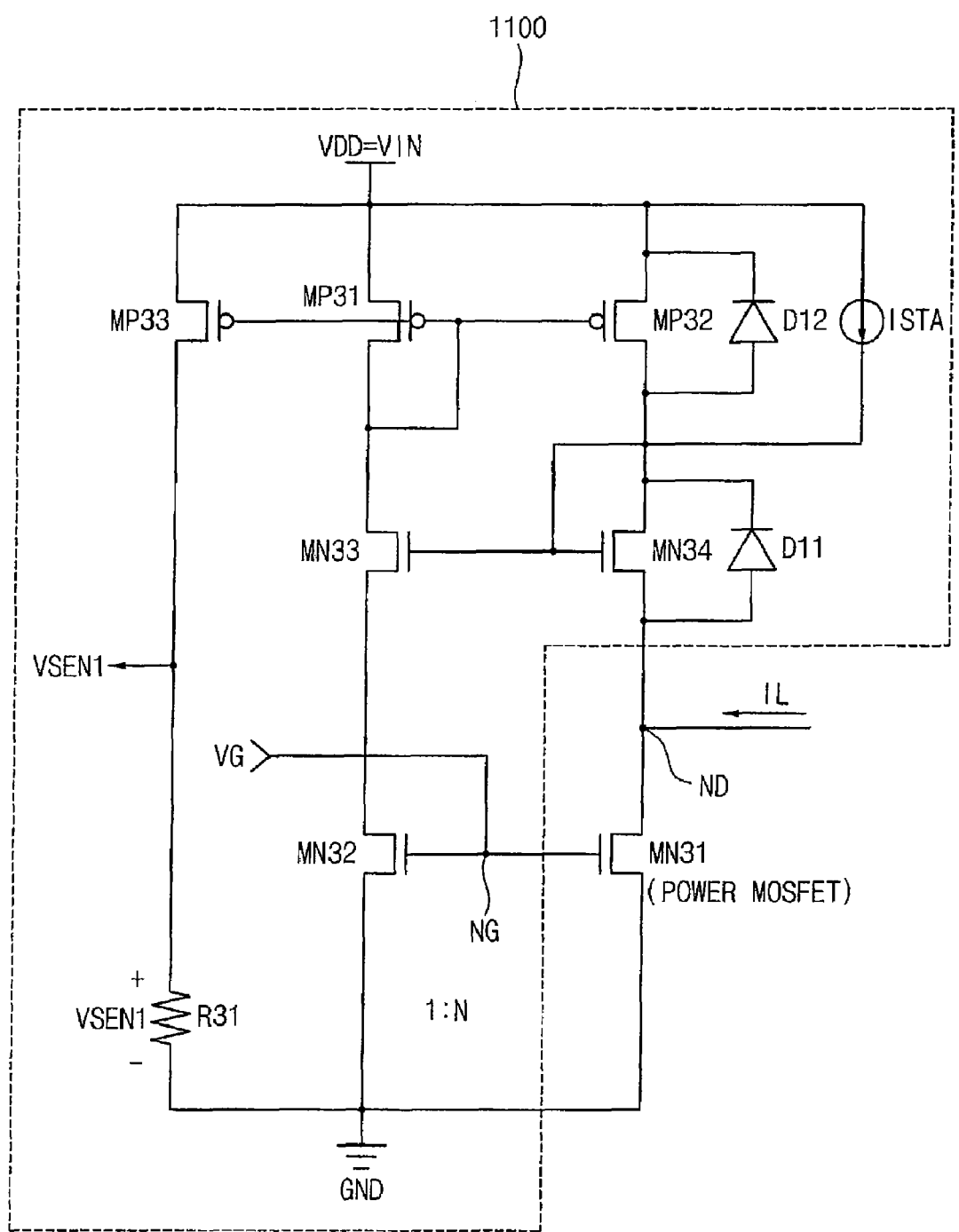
FIG. 10 is a circuit diagram further illustrating another exemplary embodiment of the current sensing circuit in the boost converter of FIG. 5.

FIG. 10 is a circuit diagram illustrating another exemplary embodiment of a current sensing circuit included in the boost converter of FIG. 5. The current sensing circuit of FIG. 10 has a circuit structure where a start-up circuit is added to the current sensing circuit of FIG. 6. In the current sensing circuit of FIG. 10, only the location of the start-up circuit is different from the location of the start-up circuit in FIG. 9. Therefore, the operation of the current sensing circuit of FIG. 10, which is similar to the operation of the current sensing circuit of FIG. 9, will not be described.

The current source ISTA is included between a drain of the NMOS transistor MN34 and the supply voltage VDD for stably starting the current sensing amplifier comprised of NMOS transistors MN33 and MN34 and PMOS transistors MP31 and MP32. Current source ISTA also advantageously results in a fast transient response.

FIG. 11 is a circuit diagram illustrating still another exemplary embodiment of a current sensing circuit included in the boost converter of FIG. 5. The current sensing circuit of FIG. 11 is similar to that in FIG. 6 except that blocking transistors MN35 and MN36 are added.

Referring to FIG. 11, the current sensing circuit 1100 includes NMOS transistors MN31 to MN34, blocking transistors MN35 and MN36, PMOS transistors MP31 to MP33 and a resistor R31.

The NMOS transistors MN31 and MN32 switch in response to a gate control voltage VG. The blocking transistor MN36 has a source connected to a drain of the switching device MN31 and a gate connected to a gate of the switching device MN31. The blocking transistor MN35 is comprised of an NMOS transistor and has a source connected to a drain of the sensing transistor MN32 and a gate connected to a gate of the sensing transistor MN32.

Each of the NMOS transistor MN34 and the PMOS transistor MP31 has a diode-connected structure. The NMOS transistor MN34 and the NMOS transistor MN33 form a current-mirror circuit, and the PMOS transistor MP31 and the PMOS transistor MP32 form a current-mirror circuit. The PMOS transistor MP33 is coupled in a current-mirror form to the PMOS transistor MP31. The resistor R31 is coupled between a drain of the PMOS transistor MP33 and the ground voltage GND and generates a sensing voltage VSEN1.

The switching device MN31 may be a power MOSFET capable of conducting a high current, and the sensing transistor MN32 may have a much smaller size than the switching device MN31.

Hereinafter, the operation of the current sensing circuit 1100 of FIG. 11 will be described.

The NMOS transistor MN32 has its gate coupled to the gate of the NMOS transistor MN31, and a current proportional to a current flowing through the NMOS transistor MN31 flows through the NMOS transistor MN32.

The diodes D11 and D12 are parasitic diodes associated with the NMOS transistor MN34 and the PMOS transistor MP32, respectively.

When the NMOS transistor MN31 is in the on state, the inductor current IL flows through the NMOS transistor MN31. When the NMOS transistor MN31 is in the off state, blocking transistor MN36 prevents inductor current IL from flowing through parasitic diodes D11 and D12. The supply voltage VDD of the current sensing circuit 1100 may be the input voltage VIN of the boost converter 1000 of FIG. 5.

In FIG. 11, the NMOS transistors MN33 and MN34 and the PMOS transistors MP31 and MP32 form a current sensing amplifier. The operation of the current sensing amplifier is as mentioned above, and thus will not be described here. The current sensing circuit 1100 of FIG. 11 includes the blocking transistors MN35 and MN36, and prevents the inductor current IL from flowing through parasitic diodes D11 and D12 when the switching device MN31 is in the off state.

As shown in FIG. 11, when the blocking transistor MN36 is coupled between the source of the NMOS transistor MN34 and the drain of the switching device MN31, which is marked in FIG. 11 as node ND, the inductor current IL cannot flow through the diodes D11 and D12. The reason is as follows.

Because the gate of the blocking transistor MN36 is coupled to the gate of the switching device MN31, the blocking transistor MN36 is turned off when the switching device MN31 is in the off state. Therefore, current IL cannot flow through parasitic diode D11. Further, when the blocking transistor MN36 is coupled between the source of the NMOS transistor MN34 and the drain of the switching device MN31, the potential of the drain of the switching transistor MN31 and the potential of the drain of the sensing transistor MN32 may not be equal. Therefore, the blocking transistor MN35 is coupled between the source of the NMOS transistor MN33 and the drain of the sensing transistor MN32. Because the gate of the blocking transistor MN35 is coupled to the gate of the switching device MN31, the blocking transistor MN35 is turned off when the switching device MN31 is in the off state. That is, the blocking transistor MN35 is turned on when the blocking transistor MN36 is turned on and turned off when the blocking transistor MN36 is turned off.

The ground voltage GND is applied to the bulk of the blocking transistor MN35 and the bulk of the blocking transistor MN36 so that a reverse bias is formed between the bulk and the source or between the bulk and the drain in the blocking transistors MN35 and MN36.

FIG. 12 is a circuit diagram illustrating still another exemplary embodiment of a current sensing circuit included in the boost converter of FIG. 5.

The current sensing circuit of FIG. 12 has a circuit structure in which a start-up circuit is added to the current sensing circuit of FIG. 11. Therefore, the operation of the current sensing circuit of FIG. 12, which is similar to the operation of the current sensing circuit of FIG. 11, will not be described.

The start-up circuit starts up the current sensing amplifier and includes a current source ISTA. The current source ISTA is included between a drain of the NMOS transistor MN33 and the ground GND for stably starting the current sensing amplifier comprised of NMOS transistors MN33 and MN34 and PMOS transistors MP31 and MP32.

FIG. 13 is a circuit diagram illustrating still another exemplary embodiment of a current sensing circuit included in the boost converter of FIG. 5. The current sensing circuit of FIG. 13 has a circuit structure in which a start-up circuit is added to the current sensing circuit of FIG. 11. The current source ISTA is included between a drain of the NMOS transistor MN34 and the supply voltage VDD for stably starting the current sensing amplifier comprised of NMOS transistors MN33 and MN34 and PMOS transistors MP31 and MP32. In one embodiment, it is preferable that the start-up current supplied to start up the current sensing amplifier is less than the current flowing through the sensing transistor MN32 in order to reduce the current sensing error. For example, the start-up current may be about 1 µA.

In the current sensing circuit of FIG. 13, only the location of the start-up circuit is different from the location of the start-up circuit in FIG. 12. Therefore, the operation of the current sensing circuit of FIG. 13 will not be described.

As described above, the current sensing circuit according to the present invention includes a current sensing amplifier and may accurately sense a current flowing through a switching device. The current sensing circuit maintains the potential at the output terminal of the switching device substantially equal to the potential at the output terminal of the sensing transistor. Therefore, the current sensing circuit may generate a sensing current proportional to the current flowing through the switching device, and the boost converter including a current sensing circuit according to the present invention may generate a stable output voltage.

While the example embodiments of the present invention and its advantages have been described in detail, it should be understood that various changes, substitutions and alterations can be made herein without departing from the scope of the invention as defined by appended claims.

What is claimed is:

1. A current sensing circuit, comprising:
   a switching device coupled between an output node and a first reference voltage source, and configured to pull down the output node in response to a gate control voltage biasing the switching device in a conducting state;
   a sensing transistor coupled to the switching device, and configured to generate a sensing current proportional to a current flowing through the switching device;
   a current sensing amplifier configured to maintain a potential at the output node substantially equal to a potential at an output terminal of the sensing transistor based on a difference between an output current of the switching device and an output current of the sensing transistor, and configured to generate a current proportional to a current flowing through the sensing transistor;
   a first blocking transistor coupled between an output terminal of the switching device and the current sensing amplifier; and
   a second blocking transistor coupled between the output terminal of the sensing transistor and the current sensing amplifier.

2. The current sensing circuit of claim 1, wherein the current sensing amplifier includes:
   a first transistor having a first output terminal coupled to an output terminal of the first blocking transistor, and a control terminal and a second output terminal coupled together;
   a second transistor having a control terminal coupled to the control terminal of the first transistor, and having a first output terminal coupled to an output terminal of the second blocking transistor;
   a third transistor having a first output terminal and a control terminal commonly coupled to a second output terminal of the second transistor and having a second output terminal coupled to a second reference voltage source; and
   a fourth transistor having a control terminal coupled to a control terminal of the third transistor and having a first output terminal coupled to the second output terminal of the first transistor and having a second output terminal coupled to the second reference voltage source.

3. The current sensing circuit of claim 2, wherein each of the first transistor and the second transistor is comprised of an n-channel metal-oxide semiconductor (NMOS) transistor and each of the third transistor and the fourth transistor is comprised of a p-channel metal-oxide semiconductor (PMOS) transistor.

4. The current sensing circuit of claim 3, wherein the current sensing amplifier is configured to maintain a gate-source voltage of the first transistor substantially equal to a gate-source voltage of the second transistor using a negative feedback loop.

5. The current sensing circuit of claim 2, wherein the current sensing amplifier further comprises a start-up circuit coupled between the second output terminal of the second transistor and the first reference voltage source, and configured to start up the current sensing amplifier.

6. The current sensing circuit of claim 1 further comprising:
   a first transistor coupled in a current-mirror configuration to the current sensing amplifier; and
   a first resistor coupled between the first transistor and the first reference voltage source and configured to convert a current flowing through the first transistor into a voltage.

7. The current sensing circuit of claim 1, wherein a control terminal of the first blocking transistor and a control terminal of the second blocking transistor are commonly coupled to a control terminal of the switching device.

8. The current sensing circuit of claim 1, wherein a bulk of the first blocking transistor and a bulk of the second blocking transistor are commonly coupled to the first reference voltage source.

9. The current sensing circuit of claim 1, wherein an inductive current is provided to the output terminal of the switching device when the switching device is turned on.

10. The current sensing circuit of claim 1, wherein a size of the sensing transistor is smaller than a size of the switching device.

11. The current sensing circuit of claim 1, wherein the switching device comprises a power MOSFET or an IGBT.

12. A current sensing circuit, comprising:
   a switching device coupled between an output node and a first reference voltage source, and configured to pull down the output node in response to a gate control voltage biasing the switching device in a conducting state;
   a sensing transistor coupled to the switching device, and configured to generate a sensing current proportional to a current flowing through the switching device;
   a first blocking transistor having a first output terminal coupled to an output terminal of the switching device;

a second blocking transistor having a first output terminal coupled to the output terminal of the sensing transistor; and a current sensing amplifier comprising:
- a first NMOS transistor having a drain and a gate coupled electrically to each other, and a source coupled to a second output terminal of the first blocking transistor;
- a second NMOS transistor having a source coupled to a second output terminal of the second blocking transistor, and a gate coupled to the gate of the first NMOS transistor;
- a first PMOS transistor having a source coupled to a second reference voltage source, and a drain and a gate commonly coupled to a drain of the second NMOS transistor; and
- a second PMOS transistor having a source coupled to the second reference voltage source and a gate coupled to the gate of the first PMOS transistor and a drain coupled to the drain of the first NMOS transistor.

13. The current sensing circuit of claim 12 further comprising:
- a first transistor coupled in a current-mirror configuration to the current sensing amplifier; and
- a first resistor coupled between the first transistor and the first reference voltage source and configured to convert a current flowing through the first transistor into a voltage.

14. The current sensing circuit of claim 12 further comprising a start-up circuit configured to start up the current sensing amplifier.

15. The current sensing circuit of claim 12, wherein a control terminal of the first blocking transistor and a control terminal of the second blocking transistor are commonly coupled to a control terminal of the switching device.

16. A current sensing circuit, comprising:
- a switching transistor coupled between a first node and a first reference potential;
- a sensing transistor coupled between a second node and the first reference potential, a gate of the switching transistor being coupled to a gate of the sensing transistor;
- a first blocking transistor coupled between the first node and a third node, and configured to be in a non-conducting state when the switching transistor is in a non-conducting state;
- a second blocking transistor coupled between the second node and a fourth node, and configured to be in a non-conducting state when the sensing transistor is in a non-conducting state; and
- a current sense amplifier coupled between a second reference potential and the third and fourth nodes, the current sense amplifier comprising first and second current mirror circuits configured to ensure that the first and second nodes remain at substantially the same potential when the switching and sensing transistors as well as the first and second blocking transistors are biased in a conducting state.

17. The current sensing circuit of claim 16 wherein:
- the first current mirror circuit comprises two n-channel transistors coupled together in a current mirror configuration; and
- the second current mirror circuit comprises two p-channel transistors coupled together in a current mirror configuration.

18. The current sensing circuit of claim 17 wherein:
- the second current mirror circuit is coupled between the second reference potential and the first current mirror circuit, and
- the first current mirror circuit is coupled between the second current mirror circuit and the third and fourth nodes.

19. The current sensing circuit of claim 16 wherein:
- the switching transistor has an on-resistance that is a factor of N smaller than an on-resistance of the sensing transistor, N being a positive integer, and
- when the switching and sensing transistors are in a conducting state, the current sense amplifier operates to maintain the third and fourth nodes at substantially the same potential such that a current flowing through the sensing transistor is smaller than a current flowing through the switching transistor by a factor approximately equal to N.

20. The current sensing circuit of claim 16 further comprising a startup circuit coupled to the current sense amplifier and configured to conduct a staff up current in order to start up the sense amplifier when the switching and sensing transistors switch from non-conducting state to conducting state.

21. The current sensing circuit of claim 20 wherein the start up current is smaller than a current flowing through the sensing transistor when the sensing transistor is in a conducting state.

22. The current sensing circuit of claim 20 wherein the start up circuit is coupled between the current sense amplifier and the first potential, and the start up current flows in the direction from the current sense amplifier to the first potential.

* * * * *